United States Patent
Andrews

(10) Patent No.: US 8,278,704 B2
(45) Date of Patent: Oct. 2, 2012

(54) STRUCTURE AND METHOD FOR FORMING LATERALLY EXTENDING DIELECTRIC LAYER IN A TRENCH-GATE FET

(75) Inventor: John Tracey Andrews, Eagle Mountain, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/907,805

(22) Filed: Oct. 19, 2010

(65) Prior Publication Data

US 2011/0031551 A1 Feb. 10, 2011

Related U.S. Application Data

(63) Continuation of application No. 12/576,120, filed on Oct. 8, 2009, now Pat. No. 7,855,115, which is a continuation of application No. 11/166,356, filed on Jun. 24, 2005, now Pat. No. 7,648,877.

(51) Int. Cl.
*H01L 29/792* (2006.01)

(52) U.S. Cl. .................. 257/330; 257/E29.262; 438/259

(58) Field of Classification Search .................. 257/330, 257/333, E21.12, E29.242, E29.262; 438/259, 438/270, 271
See application file for complete search history.

(56) References Cited

U.S. PATENT DOCUMENTS

| | | | |
|---|---|---|---|
| 6,437,386 B1 | 8/2002 | Hurst et al. |
| 6,861,296 B2 | 3/2005 | Hurst et al. |
| 7,009,247 B2 | 3/2006 | Darwish |
| 7,648,877 B2 | 1/2010 | Andrews |
| 7,855,115 B2 | 12/2010 | Andrews |
| 2003/0030104 A1 | 2/2003 | Darwish et al. |
| 2004/0082162 A1 | 4/2004 | Kang et al. |

FOREIGN PATENT DOCUMENTS

| TW | 2007/07589 A | 2/2007 |
|---|---|---|
| WO | WO 2007/001988 A2 | 1/2007 |

OTHER PUBLICATIONS

International Search Report of the International Searching Authority for Application No. PCT/US2006/023819, mailed on Jul. 7, 2008, 3 pages.
Preliminary Report on Patentability for Application No. PCT/US2006/023819, mailed on May 7, 2009, 7 pages.
Written Opinion of the International Searching Authority for Application No. PCT/US2006/023819, mailed on Jul. 7, 2008, 6 pages.
Chinese Office Action for Application No. 200680022794.5, dated Mar. 29, 2010, 10 pages.

(Continued)

*Primary Examiner* — Julio J Maldonado
*Assistant Examiner* — Sonya McCall Shepard

(57) ABSTRACT

A FET is formed as follows. A trench is formed in a silicon region. A shield electrode is formed in a bottom portion of the trench. The shield electrode is insulated from adjacent silicon region by a shield dielectric. A silicon nitride layer is formed over a surface of the silicon region adjacent the trench, along the trench sidewalls, and over the shield electrode and shield dielectric. A layer of LTO is formed over the silicon nitride layer such that those portions of the LTO layer extending over the surface of the silicon region adjacent the trench are thicker than the portion of the LTO layer extending over the shield electrode. The LTO layer is uniformly etched back such that a portion of the silicon nitride layer becomes exposed while portions of the silicon nitride layer remain covered.

27 Claims, 11 Drawing Sheets

OTHER PUBLICATIONS

Requirement for Restriction/Election for U.S. Appl. No. 11/166,356, mailed on Jun. 22, 2007, 6 pages.
Non-Final Office Action for U.S. Appl. No. 11/166,356, mailed on Sep. 18, 2007, 10 pages.
Final Office Action for U.S. Appl. No. 11/166,356, mailed on Jun. 20, 2008, 8 pages.
Non-Final Office Action for U.S. Appl. No. 11/166,356, mailed on Mar. 10, 2009, 9 pages.
Final Office Action for U.S. Appl. No. 11/166,356, mailed on Jun. 22, 2009, 11 pages.
Advisory Action for U.S. Appl. No. 11/166,356, mailed on Sep. 2, 2009, 3 pages.
Notice of Allowance for U.S. Appl. No. 11/166,356, mailed on Sep. 22, 2009, 6 pages.
Non-Final Office Action for U.S. Appl. No. 12/576,120, mailed on Mar. 24, 2010, 11 pages.
Notice of Allowance for U.S. Appl. No. 12/576,120, mailed on Sep. 7, 2010, 6 pages.

STRUCTURE AND METHOD FOR FORMING LATERALLY EXTENDING DIELECTRIC LAYER IN A TRENCH-GATE FET

CROSS-REFERENCE TO RELATED APPLICATIONS

This application is a continuation of U.S. application Ser. No. 12/576,120, filed Oct. 8, 2009, which is a continuation of U.S. application Ser. No. 11/166,356, filed Jun. 24, 2005, now U.S. Pat. No. 7,648,877, all of which are incorporated herein by reference in their entirety for all purposes.

BACKGROUND

The present invention relates in general to power field effect transistors (FETs), and in particular to trench-gate FETs with improved characteristics.

FIG. 1 is a simplified cross-section view of a portion of a conventional trench power metal-oxide-semiconductor field-effect transistor (MOSFET). A trench 10 is lined with a gate dielectric 12, and is filled with a conductive material 15, such as polysilicon, which forms the gate of the transistor. The trench extends from the surface of the silicon into the substrate down through a body region 22 and into a drain region 16. Body region 22 is p-type and drain region 16 is n-type. Drain region 16 may be electrically contacted through the substrate (not shown) of the transistor. Source regions 14 are formed adjacent to and on opposite sides of trench 10. An active channel region 20 is thus formed in body region 22 along the trench sidewalls between source regions 14 and drain region 16.

An important parameter in a trench power MOSFET is the total gate charge. In some applications of conventional trench power MOSFETs, such as DC-DC converters, the lower the gate charge the better the efficiency of the overall design. One technique in reducing the gate charge is to reduce the gate to drain capacitance by using a thick dielectric along the bottom of the gate trench. Conventional local oxidation of silicon (LOCOS) processes are used in forming the thick bottom dielectric. A silicon nitride layer is commonly formed along trench sidewalls allowing a thick dielectric to be formed along the trench bottom. However, the anisotropic etch used to remove the portion of the silicon nitride layer along the trench bottom also removes portions of the silicon nitride layer extending over the horizontal surfaces outside the trench.

When forming the thick dielectric along trench bottom, a similarly thick dielectric is formed over the silicon mesa surfaces adjacent to the trench. This thick dielectric over the mesa surfaces causes a number of problems. First, the thick dielectric over the mesa surfaces typically overhangs the upper trench corners, which can cause voiding in the gate polysilicon. Additionally, removing the thick dielectric from over the mesa surfaces requires substantial etching, which can also etch the gate oxide along the upper trench sidewalls. This can lead to gate shorts and yield problems. Also, the variability in the thickness of the dielectric over the mesa surfaces causes variability in the body implant process, which in turn causes variability in the electrical parameters.

Another well-known trench-gate structure is the shielded gate structure. The trench in this structure includes a shield electrode directly below the gate electrode. The shield electrode is insulated from adjacent silicon regions by a shield dielectric which is generally thicker than the gate dielectric. The gate and shield electrodes are insulated from one another by a dielectric layer commonly referred to as inter-poly dielectric or IPD. The IPD is required to be of high quality and to withstand the potential difference between the shield and gate electrodes. One approach in forming the IPD may be to thermally oxidize the shield electrode during the gate oxidation process. However, this approach limits the thickness of the IPD because it is formed at the same time as the gate oxide. Also, the quality of oxide grown on polysilicon is not as good as oxide grown on single crystal silicon. Therefore, it is desirable that the dielectric on the shield polysilicon (the IPD) be much thicker than the gate dielectric so that the IPD can withstand at least as much voltage as the gate dielectric is capable of.

Thus, there is a need for improved techniques for forming the thick dielectric along the trench bottom, and for forming the IPD in shielded gate structures.

SUMMARY

In accordance with an embodiment of the invention, a field effect transistor (FET) is formed as follows. A trench is formed in a silicon region. A shield electrode is formed in a bottom portion of the trench. The shield electrode is insulated from adjacent silicon region by a shield dielectric. A silicon nitride layer is formed over a surface of the silicon region adjacent the trench, along the trench sidewalls, and over the shield electrode and shield dielectric. A layer of low temperature oxide (LTO) is formed over the silicon nitride layer such that those portions of the LTO layer extending over the surface of the silicon region adjacent the trench are thicker than the portion of the LTO layer extending over the shield electrode. The LTO layer is uniformly etched back such that a portion of the silicon nitride layer extending over the shield electrode and along at least a portion of the trench sidewalls becomes exposed while portions of the silicon nitride layer extending over the surface of the silicon region adjacent the trench remain covered by remaining portions of the LTO layer.

In one embodiment, the exposed portion of the silicon nitride layer is removed using an anisotropic etch process, and a dielectric layer is formed over the shield electrode using a local oxidation of silicon (LOCOS) process.

In another embodiment, prior to forming the silicon nitride layer, an nitride etch resistant layer is formed to protect the shield electrode during the removing step.

In accordance with another embodiment of the invention, a field effect transistor (FET) is formed as follows. A trench is formed in a silicon region. A shield electrode is formed in a bottom portion of the trench. The shield electrode is insulated from adjacent silicon region by a shield dielectric. An oxidation barrier layer is formed over a surface of the silicon region adjacent the trench, along the trench sidewalls, and over the shield electrode. A protective layer is formed over the oxidation barrier layer inside and outside the trench. The protective layer is partially removed such that a portion of the oxidation barrier layer extending at least over the shield electrode becomes exposed and portions of the oxidation barrier layer extending over the surface of the silicon region adjacent the trench remain covered by remaining portions of the protective layer.

In one embodiment, the exposed portion of the oxidation barrier layer is removed from over the shield electrode, and a dielectric layer is formed over the shield electrode.

In another embodiment, prior to forming the oxidation barrier layer, an insulating layer is formed over the surface of the silicon region adjacent to the trench, along the trench sidewalls, and over the shield electrode, and removing the exposed portion of the oxidation barrier layer exposes a portion of the insulating layer extending over the shield electrode.

In accordance with another embodiment of the invention, an intermediary of a FET includes a trench extending into a silicon region and a shield electrode recessed in a lower portion of the trench. The shield electrode is insulated from the silicon region by a shield dielectric. The intermediary of a FET also includes an oxidation barrier layer extending over a surface of the silicon region adjacent the trench and along the trench sidewalls but is discontinuous over the shield electrode. The intermediary of a FET also includes a protective layer extending over all horizontally extending portions of the oxidation barrier layer.

In one embodiment, an insulating layer extends over the surface of the silicon region adjacent to the trench, along the trench sidewalls and bottom, and over the shield electrode. The insulating layer is covered by the oxidation barrier layer except for the portion of the insulating layer extending over the shield electrode.

In another embodiment, the oxidation barrier layer has a substantially uniform thickness and comprises silicon nitride, and the protective layer comprises low temperature oxide (LTO).

The following detailed description and the accompanying drawings provide a better understanding of the nature and advantages of the present invention.

DETAILED DESCRIPTION

In accordance with an embodiment of the invention, a thick dielectric layer is formed along the bottom of a trench in a trench-gate FET while preventing formation of a similarly thick dielectric layer over the silicon mesa surfaces adjacent the trench by using a protective layer. The protective layer serves to protect portions of a silicon nitride layer extending over the silicon mesa surfaces during a silicon nitride etch process for removing the silicon nitride layer from along the trench bottom. In accordance with another embodiment of the invention, a similar technique is advantageously used to form the inter-poly dielectric in a shielded gate trench FET.

FIGS. 2A-2J show cross-section views at various steps in a manufacturing process for forming a trench-gate FET with a thick bottom dielectric, in accordance with an embodiment of the invention. The following description of the steps in the process flow is only exemplary and it should be understood that the scope of the invention is not to be limited to these particular examples. In particular, processing conditions such as temperature, pressure, layer thickness, and the like could be varied, without departing from the spirit of the invention.

Figure 1:
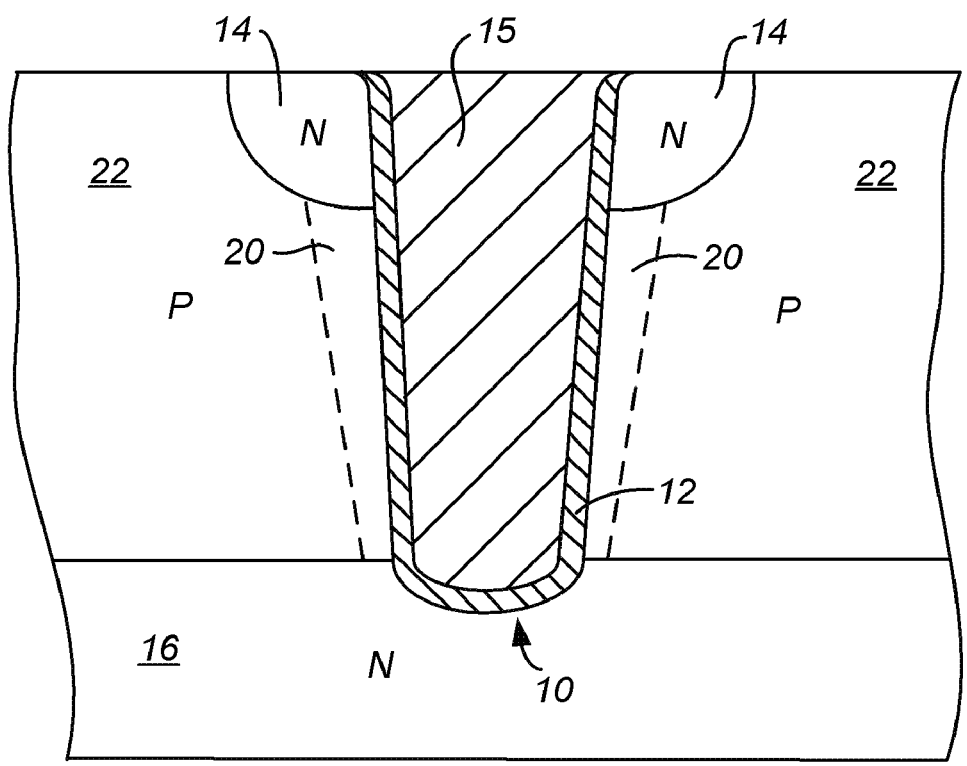
FIG. 1 shows a simplified cross-section view of a typical trench-gate MOSFET.
Figure 2A:
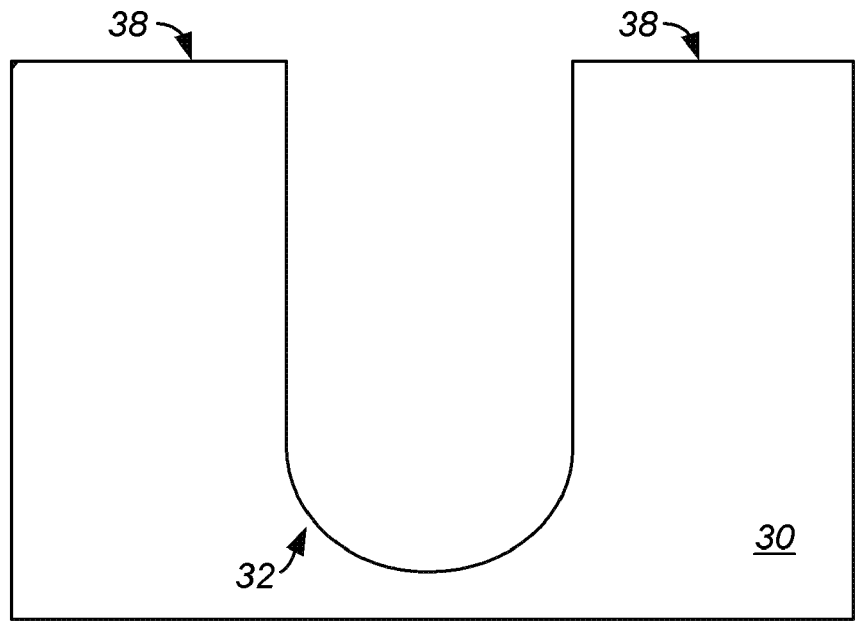
FIGS. 2A-2J show simplified cross-section views at various steps in a manufacturing process for forming a trench-gate FET with an improved thick bottom dielectric (TBD), in accordance with an embodiment of the invention.

In FIG. 2A, a silicon region 30 is provided as the basis for forming the transistor. In one embodiment, silicon region 30 is an n-type epitaxial layer formed over a highly doped n-type substrate (not shown) forming the transistor drain region. A conventional anisotropic silicon etch is performed to form a trench 32 extending into silicon region 30. An optional anneal process may be performed to round the trench corners and to reduce the defect density of silicon region 30.

Figure 2B:
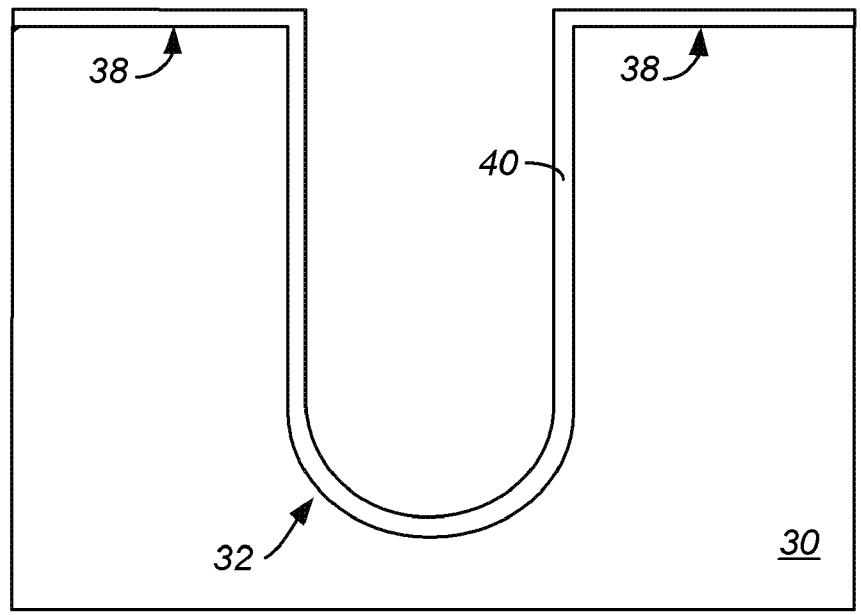

In FIG. 2B, a dielectric layer 40 is formed covering the trench bottom and sidewalls as well as surface regions 38 of the silicon mesa adjacent the trench. In one embodiment, dielectric layer 40 is a pad oxide having a thickness in the range of 200-1,000 Å using conventional techniques.

Figure 2C:
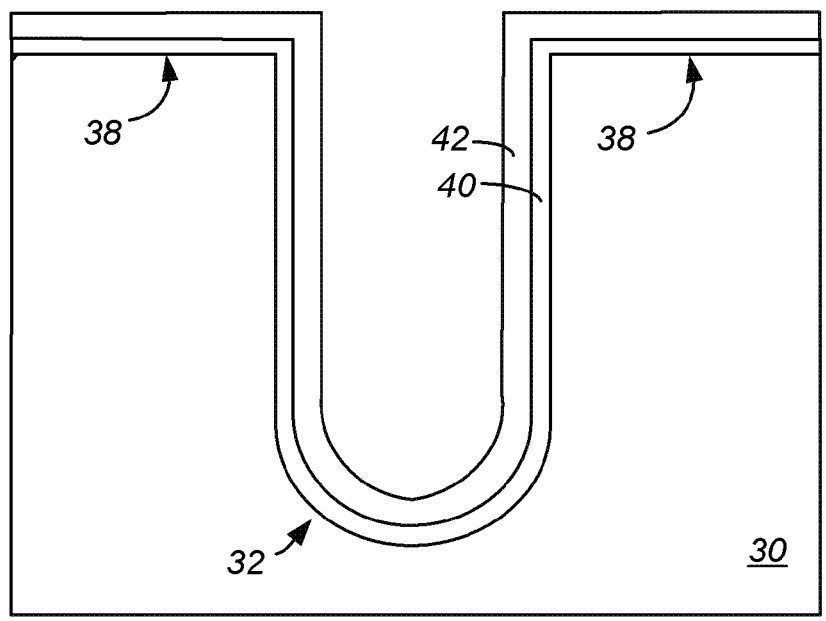

In FIG. 2C, an oxidation barrier layer 42 is formed over dielectric layer 40. The oxidation barrier layer 42 has a substantially uniform thickness. In one embodiment, layer 40 is from pad oxide, and layer 42 is from silicon nitride formed using a low pressure chemical vapor deposition (LPCVD) process. The LPCVD process helps achieve a substantially uniform silicon nitride layer. The pad oxide improves the adhesion of the silicon nitride layer, and also serves to protect the underlying silicon along the trench bottom during a nitride etch carried out in later steps corresponding to FIG. 2F. Oxidation inhibiting material other than nitride may also be used, and the precise characteristics of the oxidation barrier layer 42 may be varied by changes to gas ratios, temperature, pressure, and spacing of components in a CVD chamber.

Figure 2D:
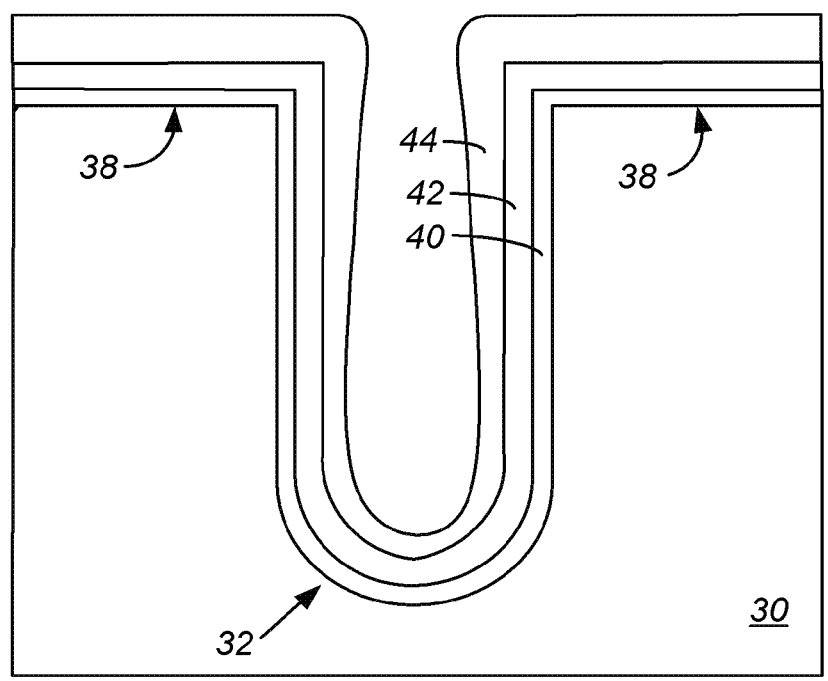

In FIG. 2D, a protective layer 44 is formed over the oxidation barrier layer 42. A low-temperature oxide (LTO) film may be used as protective layer 44. However, other materials exhibiting similar characteristics may also be used. The LTO film is deposited using a standard chemical vapor deposition (CVD) process. This process yields a non-uniform film which is thickest over mesa surfaces 38 and gradually thins down along the trench sidewalls to a smaller thickness along the lower portion of trench sidewalls and along the trench bottom.

Figure 2E:
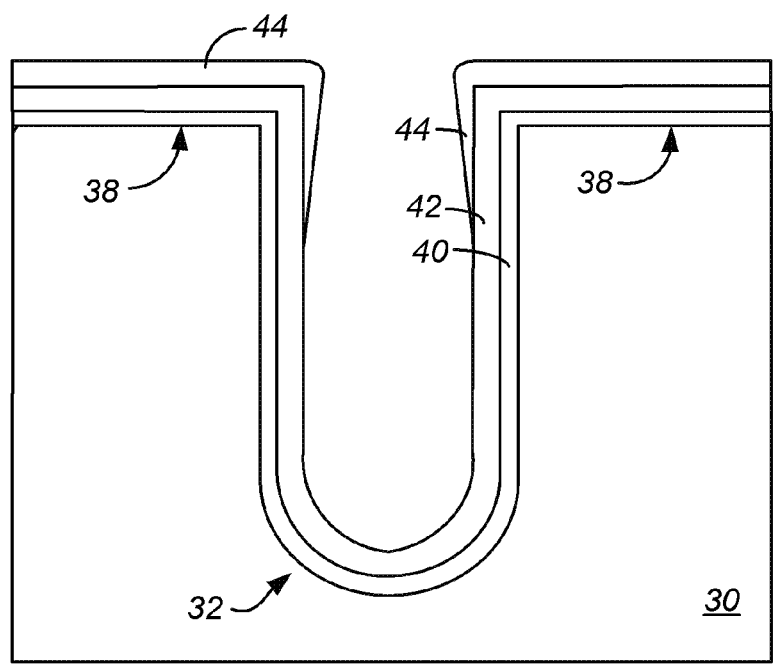

In FIG. 2E, protective layer 44 is uniformly etched back, using for example a timed wet etch process, such that a portion of oxidation barrier layer 42 extending along the trench bottom and the lower sidewalls of the trench becomes exposed while those portions of oxidation barrier layer 42 extending over silicon mesa surface regions 38 remain covered by remaining portions of protective layer 44. In one embodiment, a 50:1 HF (hydrofluoric) buffered oxide etch is used as the etching process, however other etch solutions exhibiting similar properties may also be used.

Figure 2F:
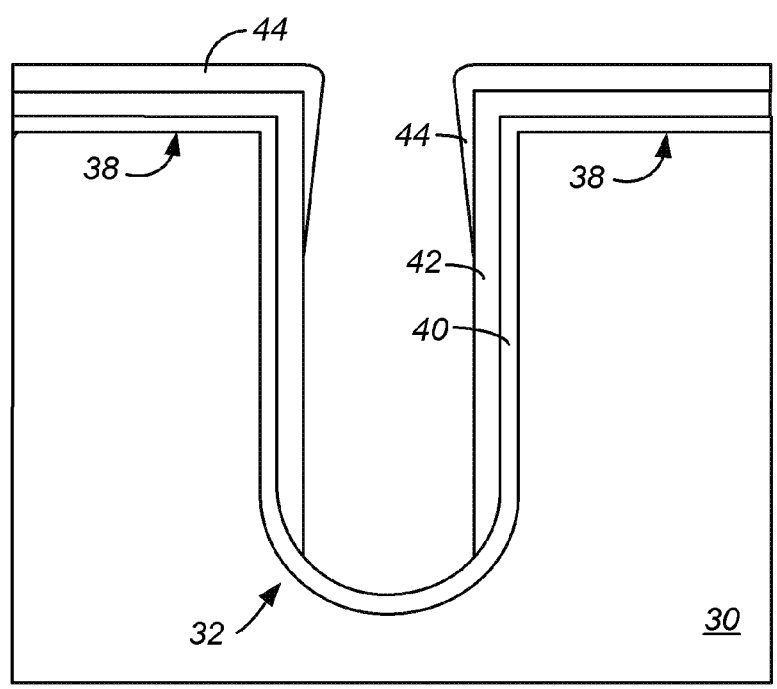

In FIG. 2F, a portion of oxidation barrier layer 42 is removed from the trench bottom. In the embodiment where oxidation barrier layer 42 is from silicon nitride, the portion of the silicon nitride layer along the trench bottom is removed using a highly directional anisotropic etch process. This exposes the pad oxide layer along the trench bottom. The presence of protective layer 44 prevents the etch process from removing the oxidation barrier layer 42 from over the silicon mesa surfaces 38. Pad oxide layer 40 prevents the nitride etch from attacking the underlying silicon along the trench bottom. In alternative embodiments, a variety of etchant materials and etch environments may be used. Etch variables such as temperature, pressure and RF power of the etching process may be tuned to accomplish the desired anisotropic etch process.

Figure 2G:
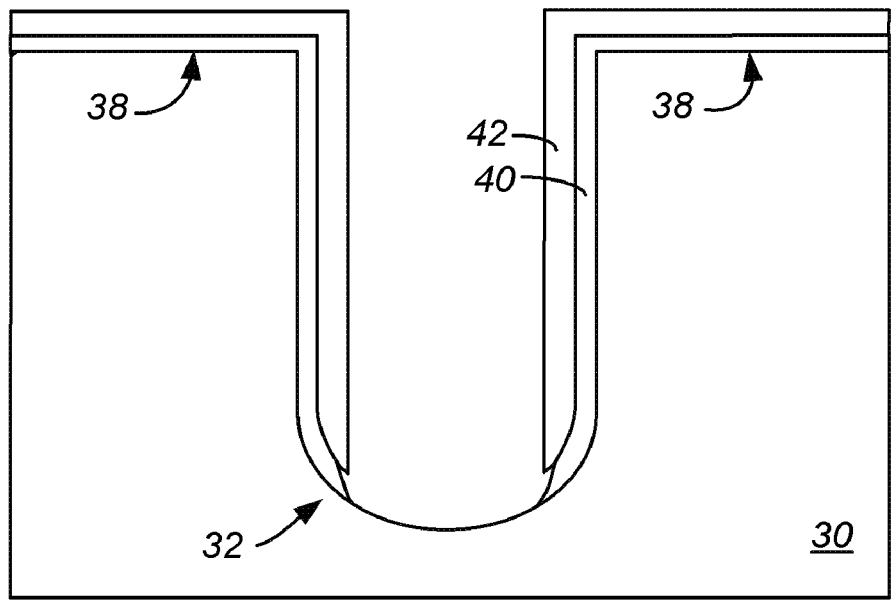

In FIG. 2G, another wet etch process is used to remove the remaining portions of protective layer 44. This will also remove the exposed portion of pad oxide layer 40 along the trench bottom although such removal is not necessary. A surface area of silicon region 30 along the trench bottom is thus exposed. In an exemplary embodiment, a 50:1 HF buffered oxide etch is used as the etching process, however other etch solutions exhibiting similar properties may also be used.

Figure 2H:
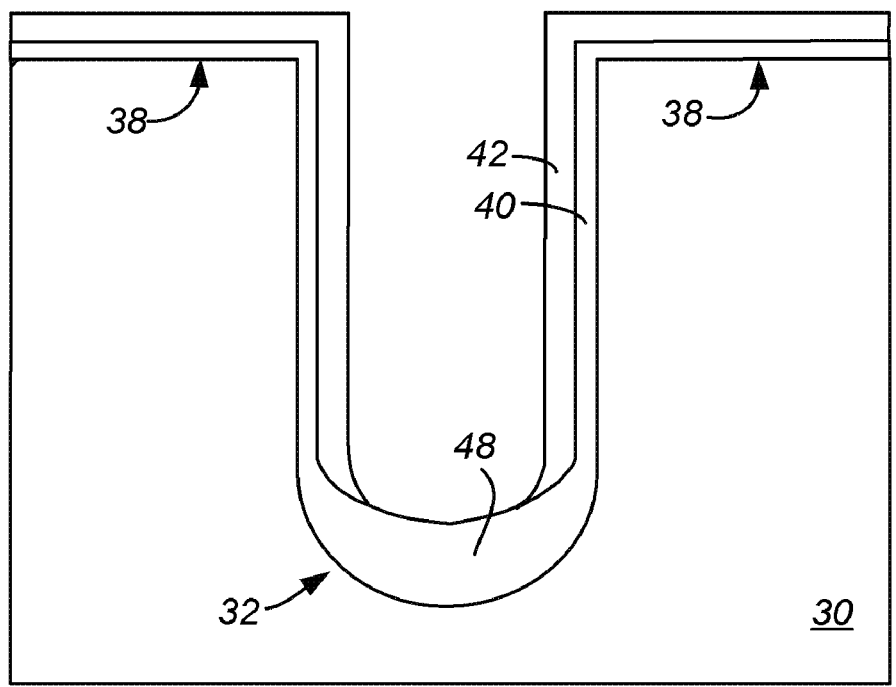

In FIG. 2H, a thick layer of oxide 48 is formed along the exposed silicon surface area along the trench bottom using conventional local oxidation of silicon (LOCOS) process. The oxidation step consumes a portion of the exposed silicon region. Oxidation barrier layer 42 inhibits oxidation of the silicon along trench sidewalls and the top surface regions 38 during the LOCOS process. In one embodiment, the thick bottom dielectric (TBD) layer 48 is formed using an oxidation process in the temperature range of, for example, 800-1250° C. The process can be either a wet or dry oxidation, depending on the capability of the oxidation barrier layer 42. The desired thickness of TBD layer 48 can be obtained by altering the parameters of the oxidation process. In one embodiment, in the steps corresponding to FIG. 2G, the remaining portions of protective layer 44 are selectively removed such that pad oxide layer 40 along the trench bottom remains intact. This results in formation of an even thicker TBD.

Figure 2I:
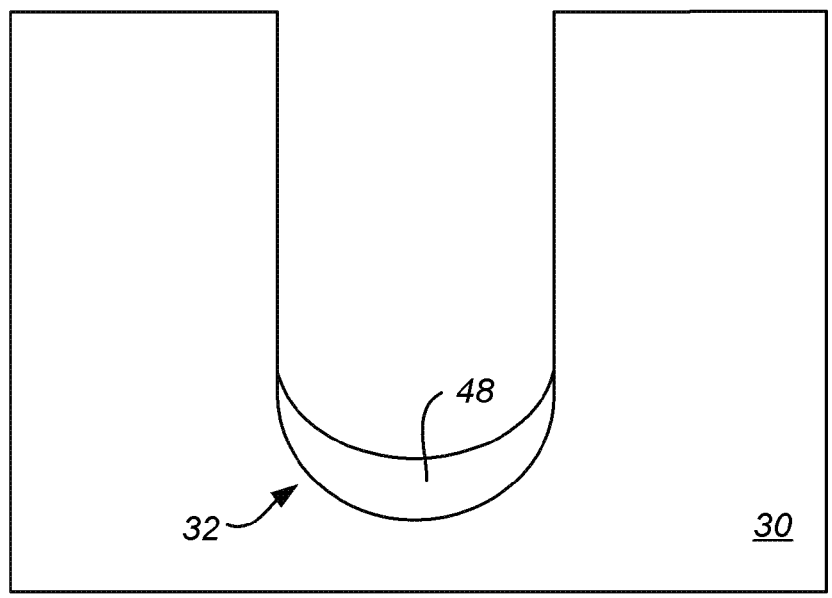

In FIG. 2I, a pair of conventional etch processes are carried out to remove oxidation barrier layer 42 and pad oxide 40, leaving only the TBD layer 48 along the trench bottom. In an exemplary embodiment, a conventional silicon nitride etch process is used to remove silicon nitride layer 42, and a conventional oxide etch process is used to remove pad oxide layer 40. The oxide etch process also removes a thin layer off the top of TBD layer 48, however this amount may be compensated for by modifying the oxide growth recipe parameters during the formation of TBD layer 48.

Figure 2J:
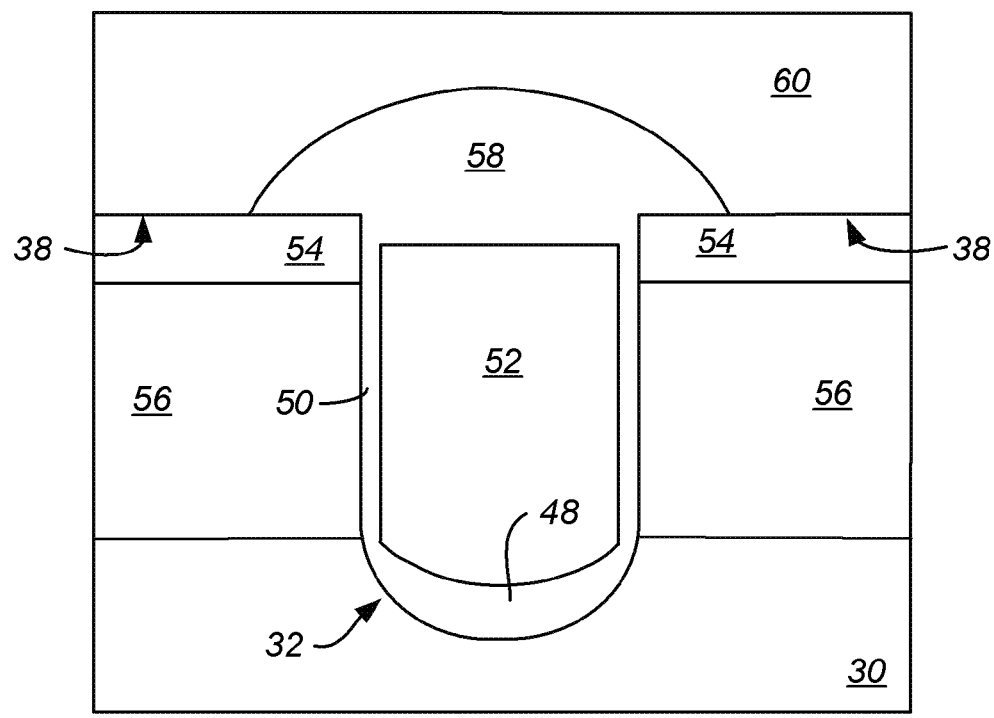

With the formation of the TBD layer, the remaining portions of the trench FET structure can be formed using any one of a number of known techniques, one of which is briefly described next. In FIG. 2J, a gate dielectric layer 50 is formed along the trench sidewalls. A recessed gate electrode 52, e.g., from polysilicon, is then formed in the trench. Body regions 56 of p-type conductivity and source regions 54 of n-type conductivity are formed in silicon region 30 using conventional ion implantation techniques. Alternatively, source regions 54 and body regions 56 can be formed prior to etching the trench in silicon region 30.

The cross section in FIG. 2J corresponds to an embodiment where an open cell configuration is used with source regions 54 and trenches 32 being stripe-shaped extending parallel to one another. In this embodiment, conventional techniques are used to form heavy body regions of p-type conductivity periodically along the source stripes. The heavy body regions extend through source regions 54 and terminate in body regions 56. A dielectric layer, e.g., BPSG, is formed over the structure and patterned, and a reflow process results in formation of a dielectric dome 58 extending over the trench and portions of source regions 54. A top metal layer 60 for electrically contacting source regions 54 and the heavy body regions is formed over the entire structure. The structure and method of the present invention are not limited to open cell configuration. The implementation of the present invention in a closed cell configuration would be obvious to one skilled in this art in view of this disclosure.

As can be seen in FIG. 2F, protective layer 44 prevents the horizontally-extending portions of silicon nitride layer 42 over the silicon mesa surfaces from being removed, which in turn prevents the formation of the thick dielectric over the silicon mesa surfaces. This is advantageous for a number of reasons. First, the absence of a thick dielectric over the mesa surfaces greatly reduces the chance of polysilicon voiding, thus improving the manufacturing yield. Second, there is no need to remove the thick dielectric from over the silicon mesa surfaces after etching back the polysilicon layer, thus reducing the number of processing steps and eliminating the possibility of removing portions of the gate dielectric from along the upper trench sidewalls. Third, the absence of the thick dielectric over the mesa surfaces reduces the variability in the body implant process, thus allowing for better controlled implant characteristics as well as reducing variations in the electrical parameters of the transistor. Finally, the TBD is formed in a self-aligned manner. That is, no masking layer is used in the process sequence leading to formation of the TBD.

The process steps for forming the TBD described above may be advantageously integrated with the process described in the commonly assigned patent application Ser. No. 10/442,670, titled "Structure and Method for Forming a Trench MOSFET Having Self-Aligned Features", filed May 20, 2003, incorporated herein by reference in its entirety, to obtain a FET with superior characteristics.

A similar technique to that for forming the TBD layer 48 may be advantageously used to form the inter-poly dielectric (IPD) layer in a shielded gate FET. FIGS. 3A-3J show cross-section views at various steps in a manufacturing process for forming such a shielded gate FET, in accordance with another embodiment of the invention.

Figure 3A:
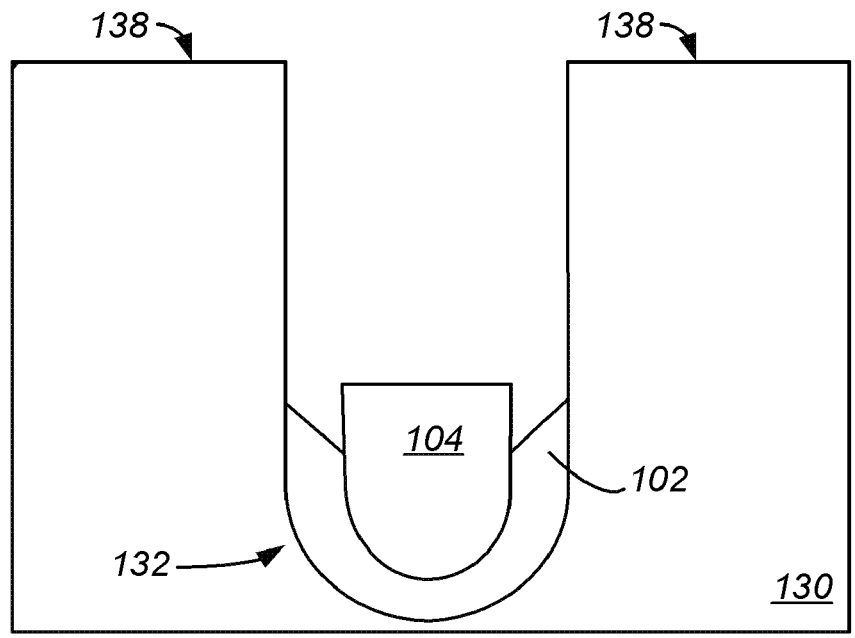
FIGS. 3A-3J show simplified cross-section views at various steps in a manufacturing process for forming a shielded gate trench FET with an improved inter-poly dielectric (IPD), in accordance with another embodiment of the invention.

In FIG. 3A, a trench 132 is formed in silicon region 130, and a shield dielectric layer is formed along the trench sidewalls and bottom and over the silicon surface 138 adjacent the trench using conventional techniques. A shield electrode 104, e.g., from polysilicon, is then formed in the lower portion of the trench over the shield dielectric layer using known techniques. A wet etch step is then carried out to remove the exposed portions of the shield dielectric layer, i.e., the portions over silicon surface 138 and along upper portions of trench sidewalls, thus leaving behind recessed shield dielectric 102. Next, the IPD is formed using a similar technique to that for forming the TBD in the FIGS. 2A-2J embodiment.

Figure 3B:
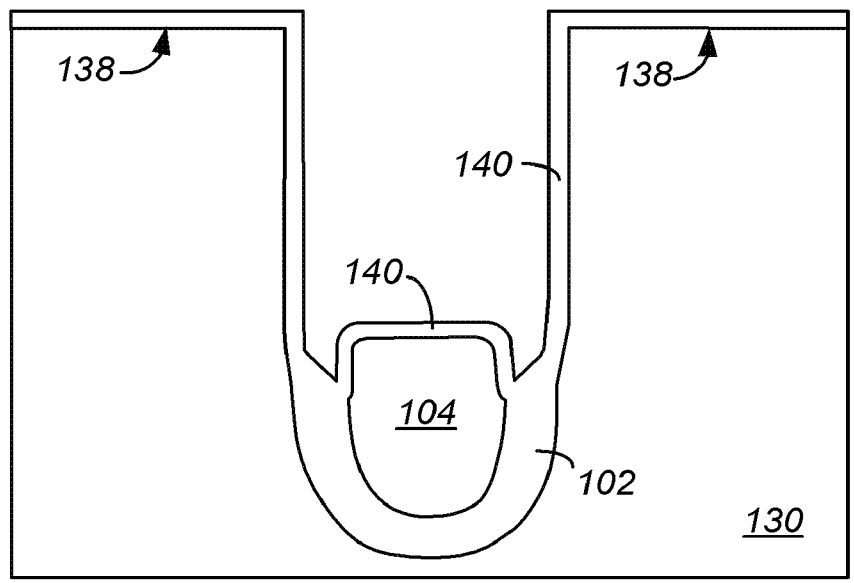
Figure 3C:
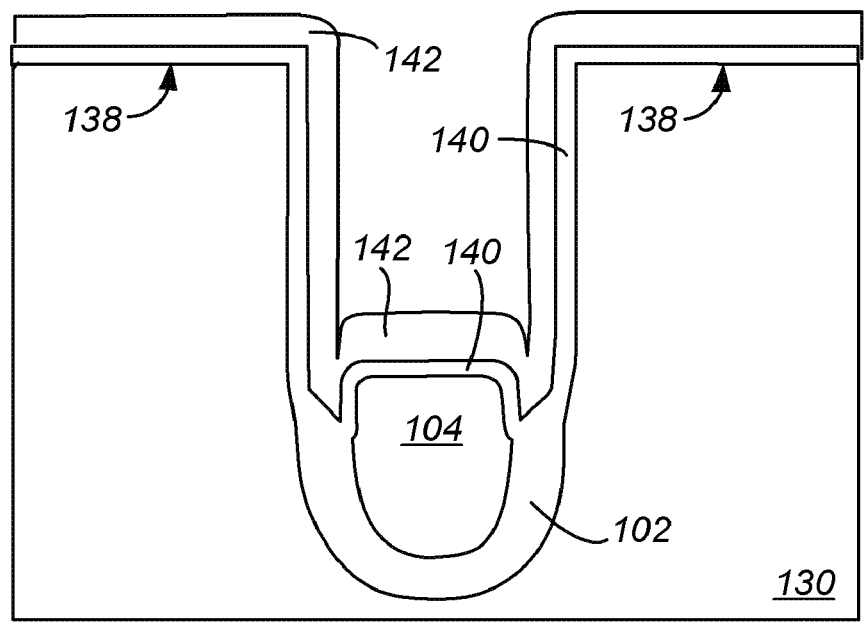

In FIG. 3B, a dielectric layer 140 is formed over the structure, covering the silicon surface 138 and extending along the trench sidewalls and over shield electrode 104. In one embodiment, dielectric layer 140 is a thermally grown pad oxide layer. In FIG. 3C, an oxidation barrier layer 142 is then formed over dielectric layer 140. Silicon nitride may be used as the oxidation barrier layer, however, other materials exhibiting similar oxidation inhibiting properties may also be used. The LPCVD process may be used to form a substantially uniform silicon nitride layer.

Figure 3D:
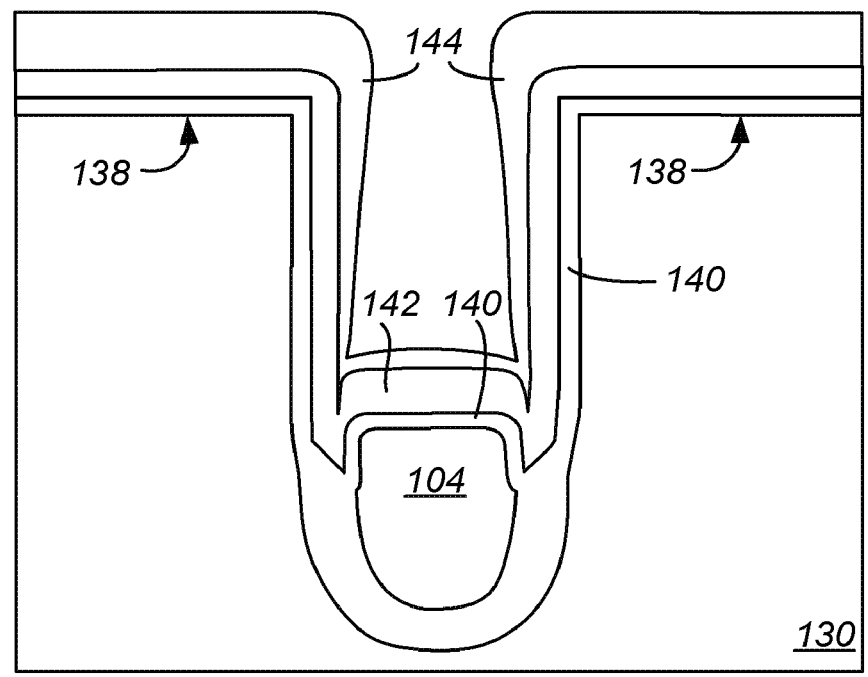

In FIG. 3D, a protective layer 144 is formed over oxidation barrier layer 142. A low-temperature oxide (LTO) film may be used as protective layer 144 however other materials exhibiting similar characteristics may also be used. The LTO film is deposited using a standard chemical vapor deposition (CVD) process. This process yields a non-uniform film which is thickest over mesa surfaces 138 and gradually thins down along the trench sidewalls to a smaller thickness along the lower portion of trench sidewalls and over shield electrode 104.

Figure 3E:
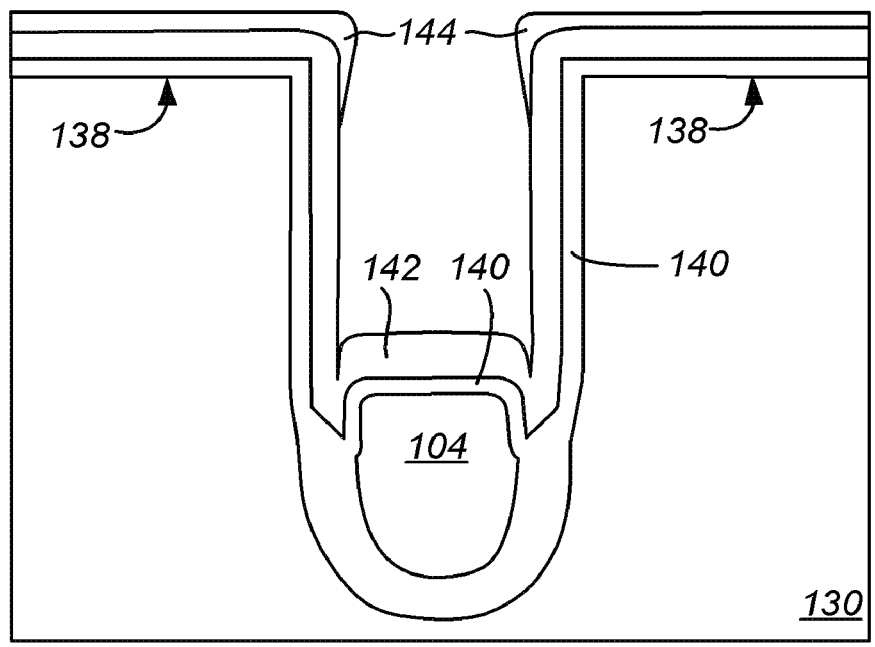

In FIG. 3E, protective layer 144 is uniformly etched back, using for example a timed wet etch process, such that a portion of oxidation barrier layer 142 extending over shield electrode 104 and along the lower sidewalls of the trench becomes exposed while those portions of oxidation barrier layer 142 extending over silicon mesa surface regions 138 remain covered by remaining portions of protective layer 144.

Figure 3F:
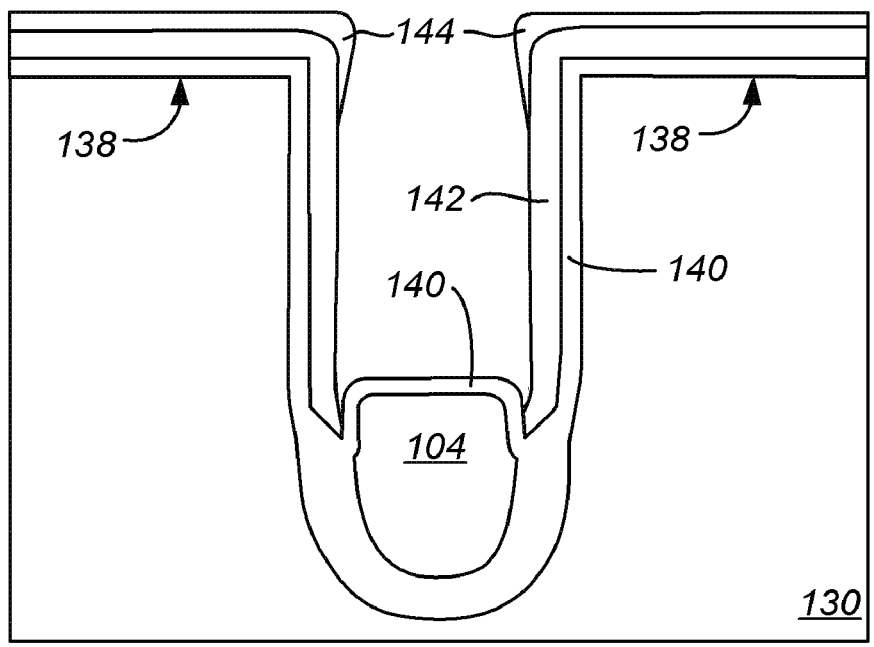

In FIG. 3F, a portion of oxidation barrier layer 142 is removed from over shield electrode 104. In the embodiment where layer 142 is from silicon nitride, the portion of silicon nitride layer extending over the shield electrode is removed using a highly directional anisotropic etch process. This exposes the portion of pad oxide layer 140 extending over the shield electrode. The presence of protective layer 144 prevents the etch process from removing the oxidation barrier layer 142 from over silicon mesa surfaces 138. Pad oxide layer 140 prevents the nitride etch from attacking the underlying polysilicon shield electrode.

Figure 3G:
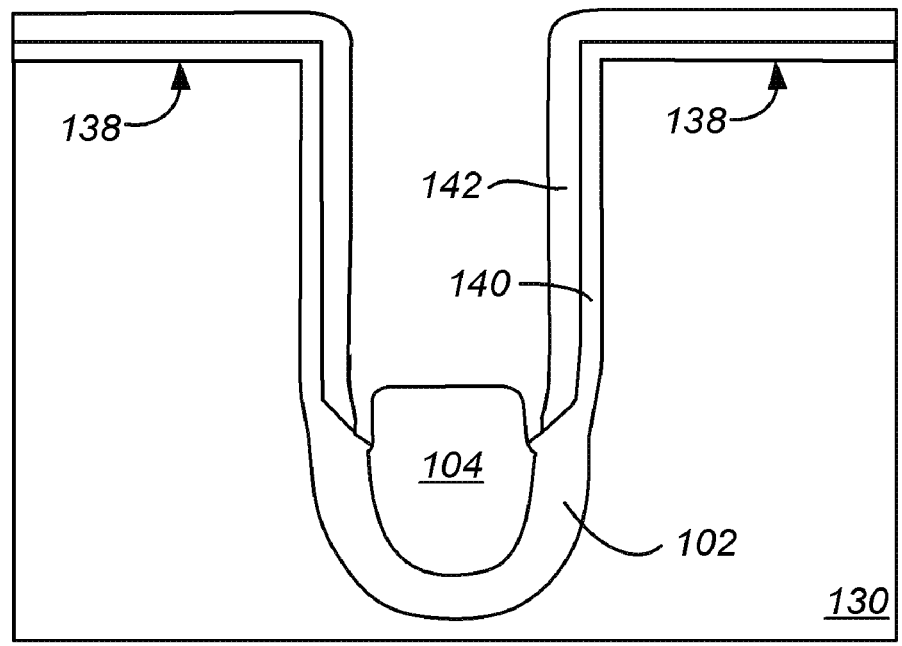
Figure 3H:
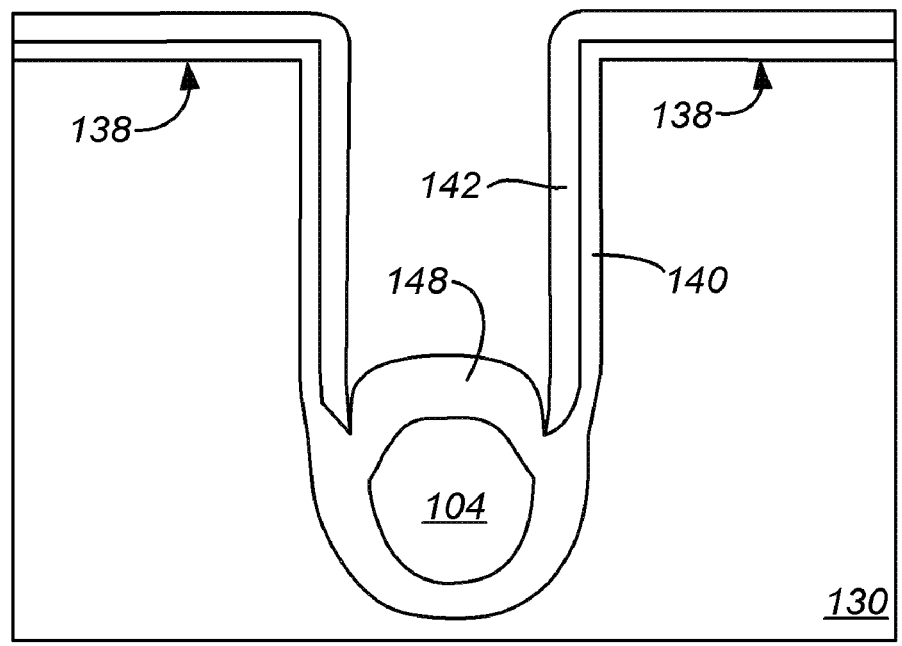

In FIG. 3G, another wet etch process is used to remove the remaining portions of protective layer 144. This will also remove the exposed portion of pad oxide layer 140 along the trench bottom although such removal is not necessary. A top surface of shield electrode 104 is thus exposed. In FIG. 3H, a thick layer of inter-poly dielectric (IPD) 148 is formed along the exposed top surface of shield electrode 104 using conventional local oxidation of silicon (LOCOS) process. The oxidation step consumes a thin layer of shield electrode 104. Oxidation barrier layer 142 inhibits oxidation of the silicon along trench sidewalls and the top silicon surface regions 138 during the LOCOS process. The desired thickness of IPD layer 148 can be obtained by altering the parameters of the oxidation process. In one embodiment, in the steps corresponding to FIG. 3G, the remaining portions of protective layer 144 are selectively removed such that pad oxide layer 140 along the trench bottom remains intact. This results in formation of an even thicker IPD.

Figure 3I:
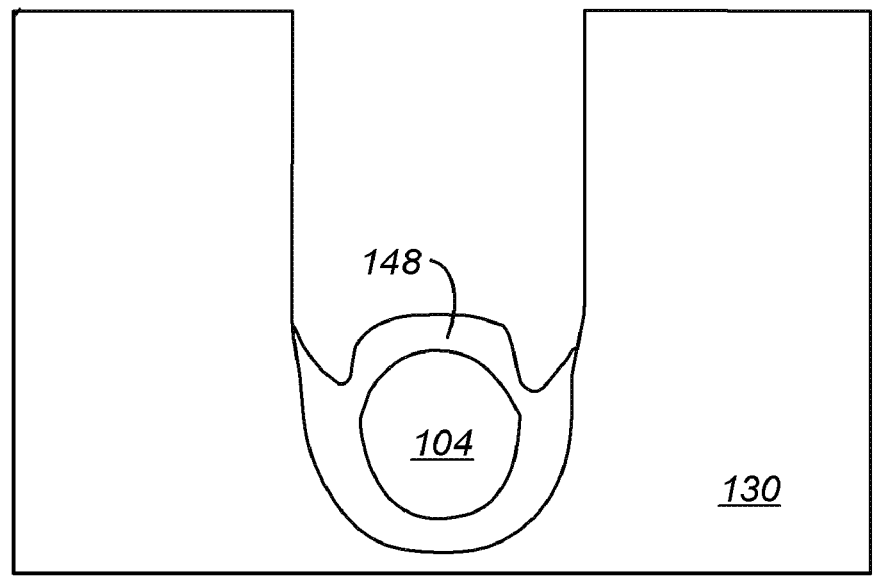

In FIG. 3I, a pair of conventional etch processes are carried out to remove oxidation barrier layer 142 and pad oxide 140, leaving only IPD layer 148 over shield electrode 104. In an exemplary embodiment, a conventional silicon nitride etch process is used to remove silicon nitride layer 142, and a conventional oxide etch process is used to remove pad oxide layer 140. The oxide etch process also removes a thin layer off the top of IPD layer 148, however this amount may be compensated for by modifying the oxide growth recipe parameters during the formation of IPD layer 148.

Figure 3J:
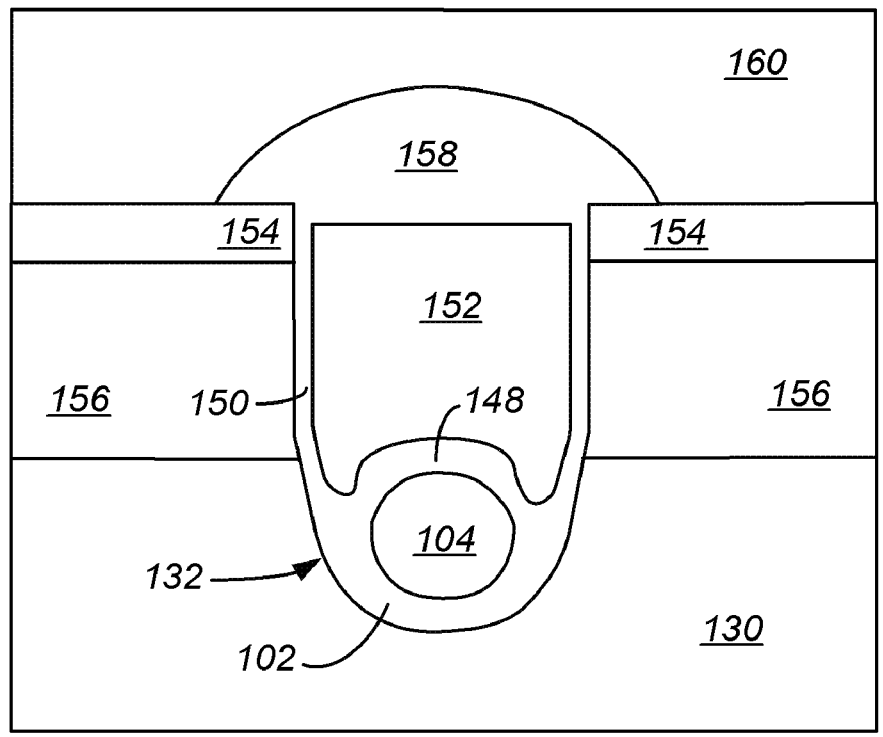

The remaining portions of the trench FET structure can be formed using any one of a number of known techniques, one of which is briefly described next. In FIG. 3J, a gate dielectric layer 150 is formed along the trench sidewalls. A recessed gate electrode 152, e.g., from polysilicon, is then formed in the trench. Body regions 156 of p-type conductivity and source regions 154 of n-type conductivity are formed in silicon region 130 using conventional ion implantation techniques. Alternatively, source regions 154 and body regions 156 can be formed prior to etching the trench in the silicon or at some other process step prior to forming the IPD. A dielectric layer, e.g., BPSG, is formed over the structure and patterned, and a reflow process results in formation of a dielectric dome 158 extending over the trench and portions of source regions 154. A top metal layer 160 is formed over the entire structure. Heavy body regions (not shown) of p-type conductivity are formed extending through source regions 154 and terminating in body regions 156 using conventional techniques. As with the previous embodiment, the structure and method of the present embodiment may be implemented in either an open cell configuration or a closed cell configuration.

The various structures and methods of the present invention may be combined with one or more of a number of charge spreading techniques as well as other device structures and manufacturing processes disclosed in the commonly assigned application Ser. No. 11/026,276, filed Dec. 29, 2004, and incorporated herein by reference in its entirety, to achieve a lower on-resistance, higher blocking capability and higher efficiency, among other advantages and features.

The cross-section views of the different embodiments may not be to scale, and as such are not intended to limit the possible variations in the layout design of the corresponding structures. Also, the various transistors can be formed in stripe or cellular architecture including hexagonal or square shaped transistor cells.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. As another example, the transistors described above have the trenches terminating before reaching the more heavily doped substrate, but they can also extend into and terminate within the substrate. Also, while the various embodiments described above are implemented in conventional silicon, these embodiments and their obvious variants can also be implemented in silicon carbide, gallium arsenide, gallium nitride, diamond or other semiconductor materials. Further, the features of one or more embodiments of the invention may be combined with one or more features of other embodiments of the invention without departing from the scope of the invention.

Therefore, the scope of the present invention should be determined not with reference to the above description but should, instead, be determined with reference to the appended claim, along with their full scope of equivalents.

What is claimed is:

1. A method of forming a FET, comprising:
   forming a trench in a silicon region;
   forming a shield electrode in a bottom portion of the trench, the shield electrode being insulated from adjacent silicon region by a shield dielectric;
   forming a nitride etch resistant layer extending over a surface of the silicon region adjacent the trench, along trench sidewalls, and over the shield electrode and the shield dielectric;
   forming a silicon nitride layer extending over the nitride etch resistant layer along the surface of the silicon region adjacent the trench, along the trench sidewalls, and over the shield electrode and the shield dielectric;
   forming a layer of low temperature oxide (LTO) over the silicon nitride layer such that those portions of the LTO layer extending over the surface of the silicon region adjacent the trench are thicker than the portion of the LTO layer extending over the shield electrode; and
   uniformly etching back the LTO layer such that a portion of the silicon nitride layer extending over the shield electrode and along at least a portion of the trench sidewalls becomes exposed while portions of the silicon nitride layer extending over the surface of the silicon region adjacent the trench remain covered by remaining portions of the LTO layer.

2. The method of claim 1 further comprising:
   removing the exposed portion of the silicon nitride layer over the shield electrode using an anisotropic etch process; and
   forming a dielectric layer extending over the shield electrode using a local oxidation of silicon (LOCOS) process.

3. The method of claim 1 wherein the nitride etch resistant layer comprises pad oxide, and extends over the surface of the silicon region adjacent to the trench and along the trench sidewalls and bottom, wherein the step of removing the exposed portion of the silicon nitride layer exposes a portion of the pad oxide layer extending along the trench bottom.

4. The method of claim 1 wherein the silicon nitride layer is formed using a low pressure chemical vapor deposition (LPCVD) process.

5. The method of claim 2 further comprising:
   prior to forming the dielectric layer, removing the remaining portions of the LTO layer.

6. The method of claim 5 further comprising:
removing remaining portions of the nitride layer;
forming a gate oxide along upper trench sidewalls; and
forming a recessed gate electrode over the shield electrode in the trench.

7. A method of forming a FET, comprising:
forming a trench in a silicon region;
forming a shield electrode in a bottom portion of the trench, the shield electrode being insulated from adjacent silicon region by a shield dielectric;
forming an insulating layer extending over a surface of the silicon region adjacent the trench, along trench sidewalls, and over the shield electrode;
forming an oxidation barrier layer extending over the insulating layer along the surface of the silicon region adjacent the trench, along the trench sidewalls, and over the shield electrode;
forming a protective layer over the oxidation barrier layer inside and outside the trench;
partially removing the protective layer such that a portion of the oxidation barrier layer extending at least over the shield electrode becomes exposed and portions of the oxidation barrier layer extending over the surface of the silicon region adjacent the trench remain covered by remaining portions of the protective layer;
removing the exposed portion of the oxidation barrier layer from over the shield electrode, wherein removing the exposed portion of the oxidation barrier layer exposes a portion of the insulating layer extending over the shield electrode; and
forming a dielectric layer over the shield electrode.

8. The method of claim 7 wherein the oxidation barrier layer comprises silicon nitride, and the step of removing the exposed portion of the oxidation barrier layer is carried out using an anisotropic etch process.

9. The method of claim 7 wherein the dielectric layer is formed using a local oxidation of silicon (LOCOS) process.

10. The method of claim 7 further comprising:
prior to forming the dielectric layer, removing the remaining portions of the protective layer.

11. The method of claim 7 further comprising:
removing remaining portions of the oxidation barrier layer;
forming a gate oxide along upper trench sidewalls; and
forming a recessed gate electrode over the dielectric layer in the trench.

12. The method of claim 7 wherein the protective layer comprises low temperature oxide (LTO).

13. The method of claim 7 wherein the portion of the protective layer extending along the surface of the silicon region adjacent the trench is thicker than the portion of the protective layer extending over the shield electrode.

14. The method of claim 8 wherein the silicon nitride layer is formed using a low pressure chemical vapor deposition (LPCVD) process.

15. The method of claim 13 wherein the step of partially removing the protective layer comprises:
uniformly etching the protective layer.

16. An intermediary of a FET, comprising:
a trench extending into a silicon region;
a shield electrode recessed in a lower portion of the trench, the shield electrode being insulated from the silicon region by a shield dielectric;
an oxidation barrier layer extending over a surface of the silicon region adjacent the trench and along the trench sidewalls but being discontinuous over the shield electrode;
an insulating layer extending over the surface of the silicon region adjacent the trench, along the trench sidewalls, and over the shield electrode, the insulating layer being covered by the oxidation barrier layer except for the portion of the insulating layer extending over the shield electrode; and
a protective layer extending over all horizontally extending portions of the oxidation barrier layer.

17. The structure of claim 16 wherein the oxidation barrier layer has a substantially uniform thickness and comprises silicon nitride.

18. The structure of claim 16 wherein the protective layer comprises low temperature oxide (LTO).

19. The structure of claim 16 wherein the insulating layer has a substantially uniform thickness and comprises oxide.

20. The structure of claim 16 wherein the protective layer has a substantially non-uniform thickness, a thickness of the protective layer near a surface of the silicon region being greater than a thickness of the protective layer near the shield electrode.

21. The structure of claim 16 further comprising a dielectric layer extending over the shield electrode.

22. An intermediary of a FET, comprising:
a trench extending into a silicon region;
an oxidation barrier layer extending over a surface of the silicon region adjacent the trench and along the trench sidewalls but being discontinuous along the trench bottom;
an insulating layer extending over the surface of the silicon region adjacent the trench and along the trench sidewalls and bottom, the insulating layer being covered by the oxidation barrier layer except for the portion of the insulating layer extending along the trench bottom; and
a protective layer extending over all horizontally extending portions of the oxidation barrier layer.

23. The structure of claim 22 wherein the insulating layer has a substantially uniform thickness and comprises oxide.

24. The structure of claim 22 wherein the oxidation barrier layer has a substantially uniform thickness and comprises silicon nitride.

25. The structure of claim 22 wherein the protective layer comprises low temperature oxide (LTO).

26. The structure of claim 22 wherein the protective layer has a substantially non-uniform thickness, a thickness of the protective layer near a surface of the silicon region being greater than a thickness of the protective layer near the trench bottom.

27. The structure of claim 22 further comprising a dielectric layer extending along the trench bottom.

* * * * *